US012813176B2

(12) United States Patent
Yao et al.

(10) Patent No.: US 12,813,176 B2
(45) Date of Patent: Nov. 24, 2026

(54) METHODS FOR FORMING LOW-κ DIELECTRIC MATERIALS WITH INCREASED ETCH SELECTIVITY

(71) Applicant: Applied Materials, Inc., Santa Clara, CA (US)

(72) Inventors: Shanshan Yao, San Jose, CA (US); Bo Xie, San Jose, CA (US); Chi-I Lang, Cupertino, CA (US); Li-Qun Xia, Cupertino, CA (US)

(73) Assignee: Applied Materials, Inc., Santa Clara, CA (US)

(*) Notice: Subject to any disclaimer, the term of this patent is extended or adjusted under 35 U.S.C. 154(b) by 503 days.

(21) Appl. No.: 18/197,552

(22) Filed: May 15, 2023

(65) Prior Publication Data

US 2024/0387167 A1 Nov. 21, 2024

(51) Int. Cl.
*H01L 21/02* (2006.01)
*H10P 14/60* (2026.01)
*H10P 14/692* (2026.01)

(52) U.S. Cl.
CPC ...... *H10P 14/6686* (2026.01); *H10P 14/6336* (2026.01); *H10P 14/6682* (2026.01); *H10P 14/6687* (2026.01); *H10P 14/6927* (2026.01)

(58) Field of Classification Search
None
See application file for complete search history.

(56) References Cited

U.S. PATENT DOCUMENTS

2003/0232495 A1* 12/2003 Moghadam ............. C23C 16/56 438/789
2004/0018319 A1* 1/2004 Waldfried ............ C09D 183/02 427/508
2004/0198070 A1 10/2004 Xia et al.
2007/0287301 A1 12/2007 Xu et al.
2009/0181187 A1* 7/2009 Jousseaume ...... H01L 21/02274 427/579
2013/0217239 A1 8/2013 Mallick et al.
2018/0330945 A1* 11/2018 Varadarajan .......... C23C 16/452
2018/0337046 A1 11/2018 Shamma et al.
2022/0084815 A1 3/2022 Xie et al.

OTHER PUBLICATIONS

International Search Report and Written Opinion for PCT/US2024/025638 mailed Aug. 6, 2024, 11 pages.

* cited by examiner

*Primary Examiner* — Asok K Sarkar
(74) *Attorney, Agent, or Firm* — Kilpatrick Townsend & Stockton LLP

(57) ABSTRACT

Exemplary semiconductor processing methods may include providing deposition precursors to a processing region of a semiconductor processing chamber. The deposition precursors may include a silicon-carbon-and-hydrogen-containing precursor. A substrate may be disposed within the processing region. The methods may include forming plasma effluents of the deposition precursors, wherein the plasma effluents are formed at a plasma power of less than or about 2,000 W. The methods may include depositing a layer of silicon-containing material on the substrate.

20 Claims, 3 Drawing Sheets

METHODS FOR FORMING LOW-κ DIELECTRIC MATERIALS WITH INCREASED ETCH SELECTIVITY

TECHNICAL FIELD

The present technology relates to deposition processes and chambers. More specifically, the present technology relates to methods of producing low-materials.

BACKGROUND

Integrated circuits are made possible by processes which produce intricately patterned material layers on substrate surfaces. Producing patterned material on a substrate requires controlled methods for forming and removing material. Material characteristics may affect how the device operates, and may also affect how the materials are removed relative to one another. Plasma-enhanced deposition may produce materials having certain characteristics, which may affect the performance of the device. The characteristics of the material may be adjusted or enhanced by modifying the deposition conditions, such as the chemistry of precursors provided during deposition and/or processing conditions during deposition.

Thus, there is a need for improved systems and methods that can be used to produce high quality devices and structures. These and other needs are addressed by the present technology.

SUMMARY

Exemplary semiconductor processing methods may include providing deposition precursors to a processing region of a semiconductor processing chamber. The deposition precursors may include a silicon-carbon-and-hydrogen-containing precursor. A substrate may be disposed within the processing region. The methods may include forming plasma effluents of the deposition precursors, wherein the plasma effluents are formed at a plasma power of less than or about 2,000 W. The methods may include depositing a layer of silicon-containing material on the substrate.

In some embodiments, the silicon-carbon-and-hydrogen-containing precursor may be or include trimethylsilane, bis(trimethylsilyl)methane, or 1,1,3,3-tetramethyl-1,3-disilacyclobutane. The silicon-carbon-and-hydrogen-containing precursor may further include oxygen. The silicon-carbon-and-hydrogen-containing precursor may be or include dimethyldimethoxysilane, 1,1,3,3-tetramethyl-1,3-dimethoxydisiloxane, or methoxy (dimethyl) silylmethane. The deposition precursors may further include a carbon-containing precursor, a nitrogen-containing precursor, or both. The carbon-containing precursor may be or include ethylene ($C_2H_4$). The nitrogen-containing precursor comprises ammonia ($NH_3$). The methods may include increasing a flow rate of the silicon-carbon-and-hydrogen-containing precursor or a flow rate of the carbon-containing precursor, reducing a flow rate of the nitrogen-containing precursor, or both. The layer of silicon-containing material may be characterized by a thickness of greater than or about 750 Å. A pressure in the semiconductor processing chamber may be maintained at greater than or about 2 Torr. The layer of material may be characterized by a carbon concentration of greater than or about 10.0 at. %.

Some embodiments of the present technology may encompass semiconductor processing methods. The methods may include providing deposition precursors to a processing region of a semiconductor processing chamber. The deposition precursors may include a silicon-containing precursor. A substrate may be disposed within the processing region. The methods may include forming plasma effluents of the deposition precursors. The methods may include depositing a layer of silicon-containing material on the substrate. A pressure in the semiconductor processing chamber may be maintained at greater than or about 3 Torr. The layer of silicon-containing material may be characterized by a carbon concentration of greater than or about 12.0 at. %.

In some embodiments, the silicon-containing precursor may include a silicon-carbon-and-hydrogen-containing precursor or a silicon-oxygen-carbon-and-hydrogen-containing precursor. The deposition precursors may further include a nitrogen-containing precursor. The methods may include increasing a flow rate of the silicon-containing precursor while depositing the layer of silicon-containing material, reducing a flow rate of the nitrogen-containing precursor while depositing the layer of silicon-containing material, or both. The plasma effluents may be formed at a plasma power of less than or about 1,500 W. A temperature within the processing region may be maintained at less than or about 500° C.

Some embodiments of the present technology may encompass semiconductor processing methods. The methods may include providing deposition precursors to a processing region of a semiconductor processing chamber. The deposition precursors may include a silicon-containing precursor. A substrate may be disposed within the processing region. The methods may include forming plasma effluents of the deposition precursors. The methods may include depositing a layer of silicon-containing material on the substrate. The layer of silicon-containing material may be characterized by a dielectric constant of less than or about 3.5. A flow rate of the silicon-containing precursor may be increased while depositing the layer of silicon-containing material.

In some embodiments, the methods may include exposing the layer of silicon-containing material to ultraviolet light to provide a cured layer of silicon-containing material. The layer of silicon-containing material may be characterized by a carbon concentration of greater than or about 15.0 at. %.

Such technology may provide numerous benefits over conventional processing methods. For example, utilizing silicon-containing precursors that include oxygen, carbon, and/or hydrogen as well as adjusting the precursors provided during deposition may modify atomic structure of the material to increase carbon concentration in the deposited material. Additionally, adjusting operating conditions, such as pressure and plasma power, may increase carbon concentration in the deposited material. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
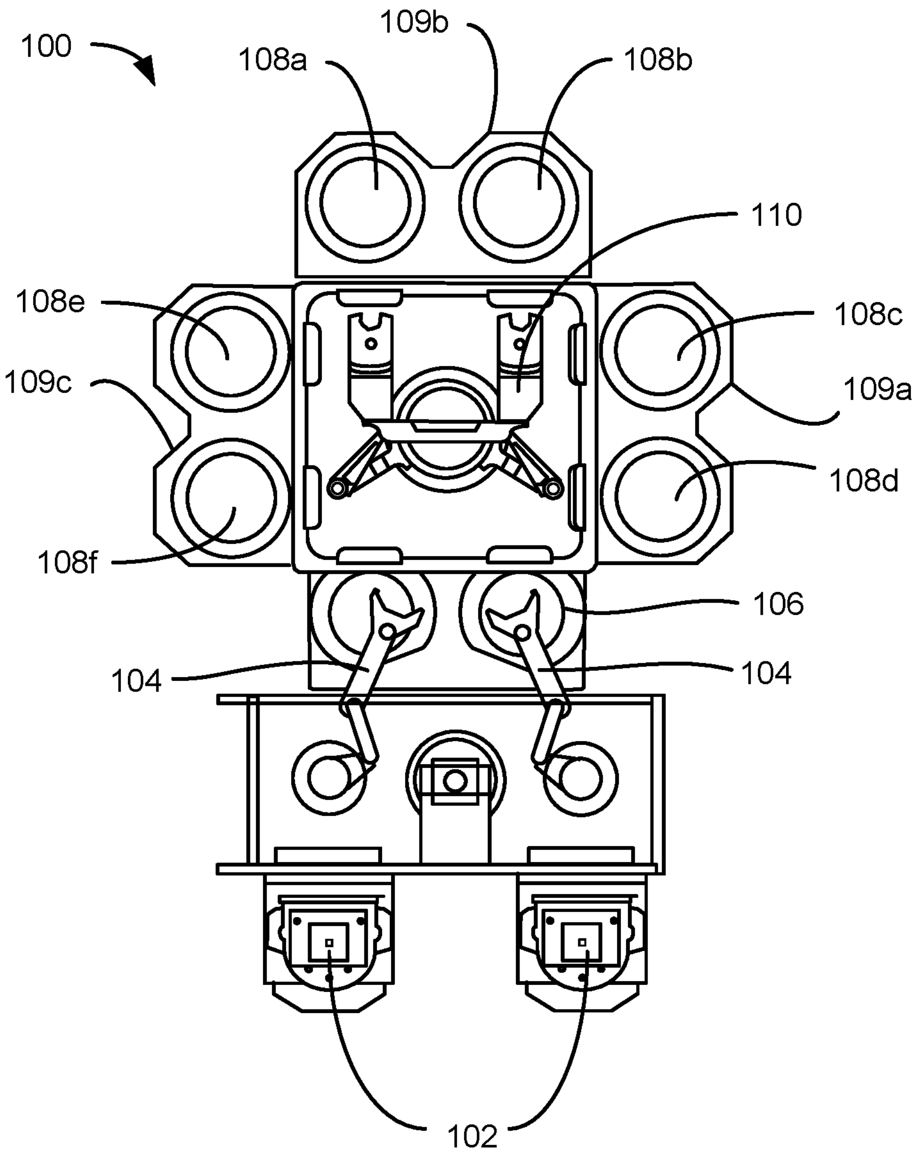
FIG. 1 shows a top plan view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

In transitioning from 2D NAND to 3D NAND (also known as VNAND), many process operations are modified from vertical to horizontal operations because the levels are distributed vertically. Additionally, as 3D NAND structures grow in the number of cells being formed, the aspect ratios of memory holes and other structures increase, sometimes dramatically. During 3D NAND processing, stacks of vertically alternating placeholder layers and inter-electrode dielectric layers exist early in the device formation. These placeholder layers may then be removed and replaced with polysilicon layers. Several operations involve etching the placeholder layers. Manufacturing VNAND devices benefits from an even removal rate of layers across the vertical distribution of the layers.

Because of the high aspect ratios of VNAND structures, penetrating the entire length to access cells at the bottom of the hole may be difficult. Conventional etch techniques may have difficulty with adequate diffusion of precursors to the bottom of the memory hole. Accordingly, the etchants often begin etching unevenly throughout the memory hole. This may end up producing a non-uniform shape through the either memory holes or slit trenches where substantial etching may have occurred at slabs or other features at or near the bottom of the memory hole.

The present technology overcomes these issues by forming a silicon-containing material to be used as making layer with high carbon concentration. Increased carbon concentration may reduce non-uniformity during etching. By reducing variation in critical dimension throughout the feature being etched may be reduced and/or minimized. The present technology may overcome these issues by forming low-κ materials with desired carbon concentration. In embodiments, these low-κ materials may be formed by using certain deposition precursors to modify the atomic structure of the deposited materials. Additionally, flow rates of deposition precursors may be adjusted during the deposition to reach desired carbon concentration. Further, processing conditions, such as pressure and plasma power, may be selected to maintain high levels of carbon in the deposited materials. Additionally, in some embodiments, an ultraviolet (UV) treatment may be performed to further increase desired properties of the material. The increased carbon concentration in the deposited materials may provide high etching selectivity during operations to etch layers of material in various semiconductor structures, such as VNAND structures.

Although the remaining disclosure will routinely identify specific deposition processes utilizing the disclosed technology, it will be readily understood that the systems and methods are equally applicable to other deposition chambers, as well as processes as may occur in the described chambers. Accordingly, the technology should not be considered to be so limited as for use with these specific deposition processes or chambers alone. The disclosure will discuss one possible system and chamber that may be used to perform deposition processes according to embodiments of the present technology before additional details according to embodiments of the present technology are described.

FIG. 1 shows a top plan view of one embodiment of a processing system 100 of deposition, etching, baking, and UV treatment chambers according to embodiments. In the figure, a pair of front opening unified pods 102 supply substrates of a variety of sizes that are received by robotic arms 104 and placed into a low pressure holding area 106 before being placed into one of the substrate processing chambers 108*a-f*, positioned in tandem sections 109*a-c*. A second robotic arm 110 may be used to transport the substrate wafers from the holding area 106 to the substrate processing chambers 108*a-f* and back. Each substrate processing chamber 108*a-f*, can be outfitted to perform a number of substrate processing operations including plasma-enhanced chemical vapor deposition, atomic layer deposition, physical vapor deposition, etch, UV treatments, pre-clean, degas, orientation, and other substrate processes including, annealing, ashing, etc.

The substrate processing chambers 108*a-f* may include one or more system components for depositing, annealing, UV treating and/or etching a dielectric or other material on the substrate. In one configuration, two pairs of the processing chambers, e.g., 108*c-d* and 108*e-f*, may be used to deposit dielectric material on the substrate, and the third pair of processing chambers, e.g., 108*a-b*, may be used to etch the deposited dielectric. In another configuration, all three pairs of chambers, e.g., 108*a-f*, may be configured to deposit stacks of alternating dielectric materials on the substrate. Any one or more of the processes described may be carried out in chambers separated from the fabrication system shown in different embodiments. It will be appreciated that additional configurations of deposition, etching, annealing, and UV treatment chambers for dielectric materials are contemplated by system 100.

Figure 2:
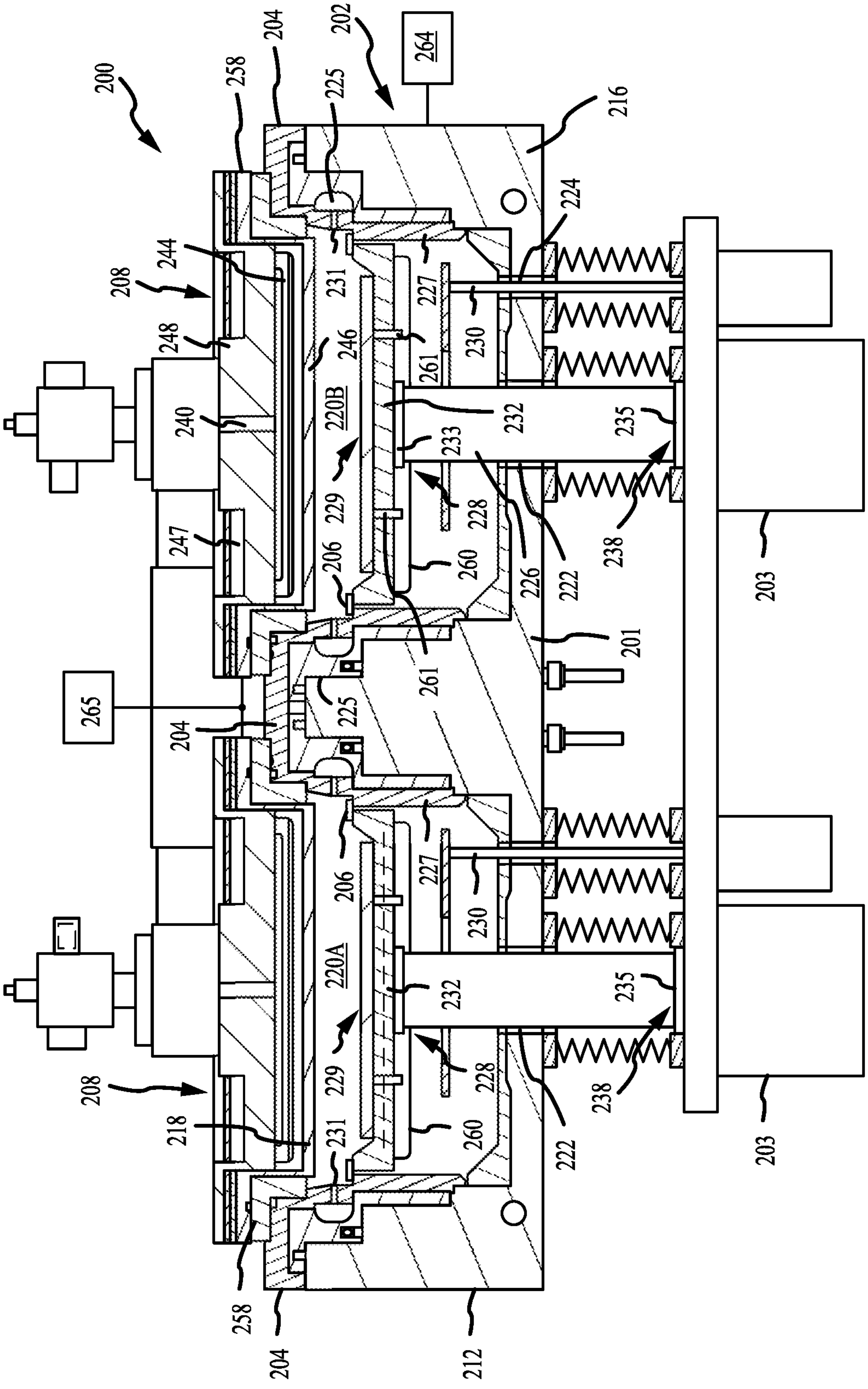
FIG. 2 shows a schematic cross-sectional view of an exemplary plasma system according to some embodiments of the present technology.

FIG. 2 shows a schematic cross-sectional view of an exemplary plasma system 200 according to some embodiments of the present technology. Plasma system 200 may illustrate a pair of processing chambers 108 that may be fitted in one or more of tandem sections 109 described above, and which may include lid stack components according to embodiments of the present technology, and as may be explained further below. The plasma system 200 generally may include a chamber body 202 having sidewalls 212, a bottom wall 216, and an interior sidewall 201 defining a pair of processing regions 220A and 220B. Each of the processing regions 220A-220B may be similarly configured, and may include identical components.

For example, processing region 220B, the components of which may also be included in processing region 220A, may include a pedestal 228 disposed in the processing region through a passage 222 formed in the bottom wall 216 in the plasma system 200. The pedestal 228 may provide a heater adapted to support a substrate 229 on an exposed surface of the pedestal, such as a body portion. The pedestal 228 may include heating elements 232, for example resistive heating elements, which may heat and control the substrate temperature at a desired process temperature. Pedestal 228 may also be heated by a remote heating element, such as a lamp assembly, or any other heating device.

The body of pedestal 228 may be coupled by a flange 233 to a stem 226. The stem 226 may electrically couple the pedestal 228 with a power outlet or power box 203. The power box 203 may include a drive system that controls the elevation and movement of the pedestal 228 within the processing region 220B. The stem 226 may also include electrical power interfaces to provide electrical power to the pedestal 228. The power box 203 may also include interfaces for electrical power and temperature indicators, such as a thermocouple interface. The stem 226 may include a base assembly 238 adapted to detachably couple with the power box 203. A circumferential ring 235 is shown above the power box 203. In some embodiments, the circumferential ring 235 may be a shoulder adapted as a mechanical stop or land configured to provide a mechanical interface between the base assembly 238 and the upper surface of the power box 203.

A rod 230 may be included through a passage 224 formed in the bottom wall 216 of the processing region 220B and may be utilized to position substrate lift pins 261 disposed through the body of pedestal 228. The substrate lift pins 261 may selectively space the substrate 229 from the pedestal to facilitate exchange of the substrate 229 with a robot utilized for transferring the substrate 229 into and out of the processing region 220B through a substrate transfer port 260.

A chamber lid 204 may be coupled with a top portion of the chamber body 202. The lid 204 may accommodate one or more precursor distribution systems 208 coupled thereto. The precursor distribution system 208 may include a precursor inlet passage 240 which may deliver reactant and cleaning precursors through a dual-channel showerhead 218 into the processing region 220B. The dual-channel showerhead 218 may include an annular base plate 248 having a blocker plate 244 disposed intermediate to a faceplate 246. A radio frequency ("RF") source 265 may be coupled with the dual-channel showerhead 218, which may power the dual-channel showerhead 218 to facilitate generating a plasma region between the faceplate 246 of the dual-channel showerhead 218 and the pedestal 228. The dual-channel showerhead 218 and/or faceplate 246 may include one or more openings to permit the flow of precursors from the precursor distribution system 208 to the processing regions 220A and/or 220B. In some embodiments, the openings may include at least one of straight-shaped openings and conical-shaped openings. In some embodiments, the RF source may be coupled with other portions of the chamber body 202, such as the pedestal 228, to facilitate plasma generation. A dielectric isolator 258 may be disposed between the lid 204 and the dual-channel showerhead 218 to prevent conducting RF power to the lid 204. A shadow ring 206 may be disposed on the periphery of the pedestal 228 that engages the pedestal 228.

An optional cooling channel 247 may be formed in the annular base plate 248 of the precursor distribution system 208 to cool the annular base plate 248 during operation. A heat transfer fluid, such as water, ethylene glycol, a gas, or the like, may be circulated through the cooling channel 247 such that the base plate 248 may be maintained at a predefined temperature. A liner assembly 227 may be disposed within the processing region 220B in close proximity to the sidewalls 201, 212 of the chamber body 202 to prevent exposure of the sidewalls 201, 212 to the processing environment within the processing region 220B. The liner assembly 227 may include a circumferential pumping cavity 225, which may be coupled to a pumping system 264 configured to exhaust gases and byproducts from the processing region 220B and control the pressure within the processing region 220B. A plurality of exhaust ports 231 may be formed on the liner assembly 227. The exhaust ports 231 may be configured to allow the flow of gases from the processing region 220B to the circumferential pumping cavity 225 in a manner that promotes processing within the system 200.

Figure 3:
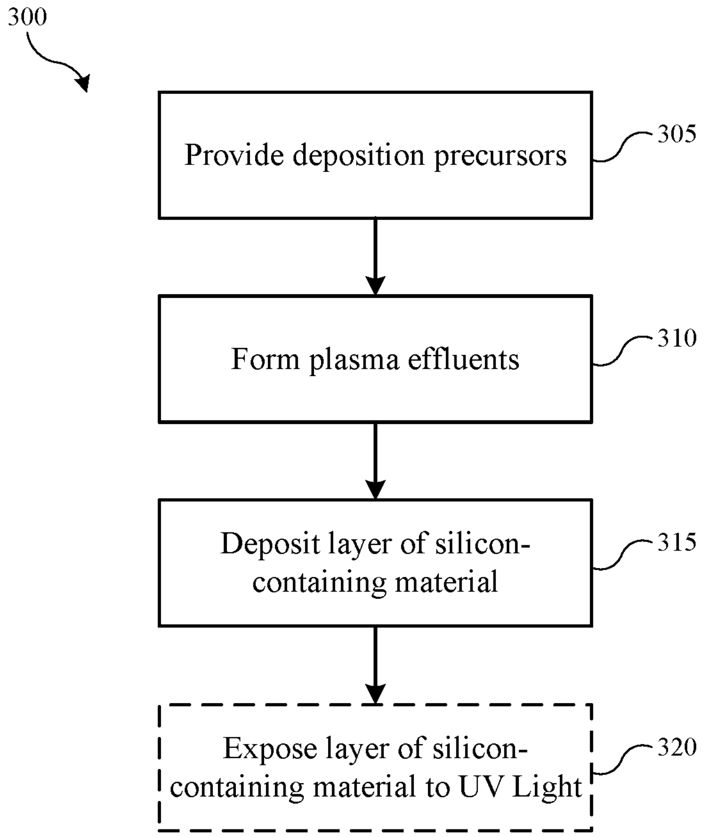
FIG. 3 shows operations of an exemplary method of semiconductor processing according to some embodiments of the present technology.

FIG. 3 shows operations of an exemplary method 300 of semiconductor processing according to some embodiments of the present technology. The method may be performed in a variety of processing chambers, including system 200 described above, as well as any other chamber in which plasma deposition may be performed. Method 300 may include a number of optional operations, which may or may not be specifically associated with some embodiments of methods according to the present technology.

Method 300 may include plasma-enhanced chemical-vapor-deposition (PECVD) processing operations to form as-deposited, low-κ materials. The method 300 may include optional operations prior to initiation of method 300, or the method 300 may include additional operations after the deposition of the low-κ material, such as a UV treatment of the low-K material. In embodiments, method 300, as shown in FIG. 3, may include providing deposition precursors into a processing region of a semiconductor processing chamber at operation 305. A substrate may be housed in the processing region of the semiconductor processing chamber as the deposition precursors are provided into the chamber.

In some embodiments, the deposition precursors may include a silicon-containing precursor. Silicon-containing precursors that may be used may be or include, but are not limited to, silane ($SiH_4$), disilane ($Si_2H_6$), trimethylsilane ($(CH_3)_3SiH$), or tetraethyl orthosilicate (TEOS). In embodiments, the silicon-containing precursor may further include carbon and hydrogen. Specific silicon-carbon-and-hydrogen-containing precursors may be or include, but are not limited to, bis(trimethylsilyl)methane or 1,1,3,3-tetramethyl-1,3-disilacyclobutane. Some silicon-containing precursors may further include oxygen, carbon, and hydrogen. For example, specific silicon-oxygen-carbon-and-hydrogen-containing precursors may be or include, but are not limited to, dimethyldimethoxysilane, 1,1,3,3-tetramethyl-1,3-dimethoxydisiloxane, or methoxy (dimethyl) silylmethane. By utilizing silicon-containing precursors also including carbon, additional carbon may be present in plasma effluents for incorporation within the deposited materials.

The deposition precursors may further include a carbon-containing precursor, a nitrogen-containing precursor, or both. Carbon-containing precursors that may be used may include, but are not limited to, ethylene ($C_2H_4$), propene ($C_3H_6$), as well as any other carbon-containing precursors that may be used in silicon-containing material formation. In embodiments, a flow rate of the carbon-containing precursor relative to the flow rate of the silicon-containing precursor and/or nitrogen-containing precursor may be maintained and/or adjusted at a flow rate ratio that assists in forming a low-κ materials with both a low dielectric constant (κ value) and high carbon incorporation. Additionally, nitrogen-containing precursors that may be used may include, but are not limited to, ammonia ($NH_3$), hydrazine ($N_2H_4$), as well as any other nitrogen-containing precursors that may be used in silicon-containing material formation. In embodiments, a flow rate of the nitrogen-containing precursor relative to the flow rate of the silicon-containing precursor and/or carbon-containing precursor may be maintained and/or adjusted at a flow rate ratio that assists in forming a low-κ materials with both a low dielectric constant (κ value) and high carbon incorporation. The deposition precursors may also include one or more carrier gases such as helium, argon, and nitrogen ($N_2$). Although the one or more carrier gases may be delivered with other deposition precursors, the carrier gases may be considered inert gases that do not react to form part of the as-deposited material. The one or more carrier gases may be delivered with other deposition precursors to serve as a diluent.

By utilizing silicon-containing precursors carbon, such as the specific precursors previously listed, increased amounts of carbon may be incorporated within the deposited material. As previously discussed, increased carbon concentration may increase etching selectivity in subsequent operations. Additionally, increased carbon concentration may provide increased critical dimension uniformity (CDU). Further, by adjusting flow rates of respective deposition precursors, as further discussed below, carbon concentration in the deposited material may further be increased.

A flow rate of the silicon-containing precursor may be greater than or about 50 sccm, greater than or about 60 sccm, greater than or about 70 sccm, greater than or about 80 sccm, greater than or about 90 sccm, greater than or about 100 sccm, greater than or about 125 sccm, greater than or about 150 sccm, greater than or about 175 sccm, greater than or about 200 sccm, greater than or about 250 sccm, greater than or about 300 sccm, greater than or about 350 sccm, greater than or about 500 sccm, greater than or about 750 sccm, greater than or about 1,000 sccm, or more. In embodiments, method 300 may include increasing a flow rate of the silicon-containing precursor from a first flow rate to a second flow rate. The first flow rate of the silicon-containing precursor and the second-flow rate of the silicon-containing precursor may be within the ranges previously discussed.

A flow rate of the carbon-containing precursor may be greater than or about 5 sccm, greater than or about 10 sccm, greater than or about 25 sccm, greater than or about 50 sccm, greater than or about 75 sccm, greater than or about 100 sccm, greater than or about 150 sccm, greater than or about 200 sccm, greater than or about 250 sccm, greater than or about 300 sccm, greater than or about 350 sccm, greater than or about 400 sccm, greater than or about 450 sccm, greater than or about 500 sccm, greater than or about 600 sccm, greater than or about 700 sccm, greater than or about 800 sccm, greater than or about 900 sccm, greater than or about 1,000 sccm, or more. In embodiments, method 300 may include increasing a flow rate of the carbon-containing precursor from a first flow rate to a second flow rate. The first flow rate of the carbon-containing precursor and the second-flow rate of the carbon-containing precursor may be within the ranges previously discussed.

A flow rate of the nitrogen-containing precursor may be greater than or about 125 sccm, greater than or about 150 sccm, greater than or about 175 sccm, greater than or about 200 sccm, greater than or about 225 sccm, greater than or about 250 sccm, greater than or about 275 sccm, greater than or about 300 sccm, greater than or about 400 sccm, greater than or about 500 sccm, greater than or about 750 sccm, greater than or about 1,000 sccm, greater than or about 1,250 sccm, greater than or about 1,500 sccm, greater than or about 1,750 sccm, greater than or about 2,000 sccm, or more. The flow rate of the nitrogen-containing precursor may also be less than or about 2,500 sccm, less than or about 2,250 sccm, less than or about 2,000 sccm, less than or about 1,750 sccm, less than or about 1,250 sccm, less than or about 1,000 sccm, or less. In embodiments, method 300 may include reducing a flow rate of the nitrogen-containing precursor from a first flow rate to a second flow rate. The first flow rate of the nitrogen-containing precursor and the second-flow rate of the nitrogen-containing precursor may be within the ranges previously discussed.

A flow rate of the one or more carrier gases may be greater than or about 200 sccm, greater than or about 300 sccm, greater than or about 400 sccm, greater than or about 500 sccm, greater than or about 750 sccm, greater than or about 1,000 sccm, greater than or about 2,000 sccm, greater than or about 3,000 sccm, greater than or about 3,000 sccm, greater than or about 4,000 sccm, greater than or about 5,000 sccm, or more. The flow rate of the combined deposition precursors may be greater than or about 250 sccm, greater than or about 500 sccm, greater than or about 750 sccm, greater than or about 1,000 sccm, greater than or about 2,500 sccm, greater than or about 5,000 sccm, or more.

In embodiments, the deposition precursors provided to the processing region of the semiconductor processing chamber may alter the pressure in the chamber. During method 300, a pressure in the semiconductor processing chamber may be greater than or about 1 Torr, greater than or about 2 Torr, greater than or about 3 Torr, greater than or about 4 Torr, greater than or about 5 Torr, greater than or about 6 Torr, greater than or about 7 Torr, greater than or about 8 Torr, greater than or about 9 Torr, greater than or about 10 Torr, greater than or about 15 Torr, greater than or about 20 Torr, greater than or about 25 Torr, greater than or about 30 Torr, greater than or about 35 Torr, greater than or about 40 Torr, greater than or about 45 Torr, greater than or about 50 Torr, or more. At increased pressures, increased residence time of the deposition precursors may result, which may allow for more reaction time and increased carbon incorporation in the deposited material.

Embodiments of method 300 may include forming plasma effluents from the deposition precursors at operation 310. The plasma effluents may be generated from the deposition precursors within the processing region, such as by providing RF power to the faceplate to generate a plasma within the processing region of the semiconductor processing chamber. The plasma effluents may be generated at any of the frequencies previously described, and may be generated at a frequency less than 15 MHz (e.g., 13.56 MHz).

In embodiments, the plasma effluents may be formed at a plasma power of less than or about 2,000 W. At increase plasma powers, such as greater than 2,000 W, increased decomposition of the silicon-containing precursor may result and carbon may be pulled out of the deposited material. At plasma powers of less than or about 2,000 W, conversely, less decomposition may occur and Si—C bonding may be preserved in the material. Accordingly, the plasma effluents may be formed at a plasma power of less than or about 1,750 W, less than or about 1,500 W, less than or about 1,400 W, less than or about 1,300 W, less than or about 1,200 W, less than or about 1,100 W, less than or about 1,000 W, less than or about 900 W, less than or about 800 W, less than or about 700 W, less than or about 600 W, less than or about 500 W, less than or about 400 W, less than or about 300 W, less than or about 200 W, or less.

Embodiments of method 300 may include depositing a silicon-containing material on the substrate at operation 315. As previously discussed, the substrate may be present in the processing region of the semiconductor processing chamber, and the silicon-containing material may be formed from plasma effluents generated by the deposition plasma also present in the processing region. The processing region and, therefore, the substrate may be characterized by a temperature less than or about 600° C., less than or about 580° C., less than or about 560° C., less than or about 540° C., less than or about 520° C., less than or about 500° C., less than or about 480° C., less than or about 460° C., less than or about 440° C., less than or about 420° C., less than or about 400° C., less than or about 380° C., less than or about 360° C., less than or about 340° C., less than or about 320° C., less than or about 300° C., or less during the deposition.

Depending on the flow rates of the deposition precursors and/or the processing conditions, carbon concentration in the material may be controlled. For example, a carbon concentration in the material may be greater than or about 10.0 at. %, and may be greater than or about 11.0 at. %, greater than or about 12.0 at. %, greater than or about 13.0 at. %, greater than or about 14.0 at. %, greater than or about 15.0 at. %, greater than or about 16.0 at. %, greater than or about 17.0 at. %, greater than or about 18.0 at. %, greater than or about 19.0 at. %, greater than or about 20.0 at. %, greater than or about 21.0 at. %, greater than or about 22.0 at. %, greater than or about 23.0 at. %, greater than or about 24.0 at. %, greater than or about 25.0 at. %, greater than or about 26.0 at. %, greater than or about 27.0 at. %, greater than or about 28.0 at. %, greater than or about 29.0 at. %, greater than or about 30.0 at. %, or more. At increased carbon concentrations, etching selectivity to underlying materials, such as silicon oxide and polysilicon, or alternating layers of silicon oxide and polysilicon, may be increased.

As explained above, the methods of the present technology include embodiments that utilize deposition precursors and processing conditions that form low-κ materials having a low dielectric constant and high carbon concentration. In embodiments of method 300, as-deposited low-κ materials may be formed as silicon-containing materials with dielectric constants less than or about 5.0, less than or about 4.8, less than or about 4.6, less than or about 4.4, less than or about 4.2, less than or about 4.0, less than or about 3.9, less than or about 3.8, less than or about 3.7, less than or about 3.6, less than or about 3.5, less than or about 3.4, less than or about 3.3, less than or about 3.2, less than or about 3.1, less than or about 3.0, less than or about 2.9, less than or about 2.8, less than or about 2.7, less than or about 2.6, less than or about 2.5, or less.

Embodiments of the method 300 may further include exposing the as-deposited silicon-and-carbon-containing material to an ultraviolet (UV) treatment at optional operation 320. In embodiments, the UV treatment may be performed in the semiconductor processing chamber used for the deposition of the low-κ material. However, it is also contemplated that the substrate with the as-deposited low-κ material may be transferred to another semiconductor processing chamber where the UV treatment operation is performed. In embodiments, the UV treatment at optional operation 320 may expose the layer of silicon-containing material to ultraviolet light to provide a cured layer of silicon-containing material. The treatment may produce a cured low-K material characterized by an increased porosity and/or lower dielectric constant (κ value) than the as-deposited material.

In some embodiments, the as-deposited silicon-containing material may be deposited to a thickness of greater than or about 750 Å, greater than or about 800 Å, greater than or about 850 Å, greater than or about 900 Å, greater than or about 950 Å, greater than or about 1,000 Å, greater than or about 1,100 Å, greater than or about 1,200 Å, greater than or about 1,300 Å, or more. The as-deposited silicon-containing material may be deposited in two or more deposition and UV-treatment cycles to build up the final, UV-treated, low-κ material. For example, the number of deposition and treatment cycles may be greater than or about three cycles, greater than or about five cycles, greater than or about ten cycles, greater than or about 15 cycles, greater than or about 20 cycles, greater than or about 30 cycles, greater than or about 40 cycles, greater than or about 50 cycles, or more.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a layer" includes a plurality of such layer, and reference to "the precursor" includes reference to one or more precursors and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing method comprising:
providing deposition precursors to a processing region of a semiconductor processing chamber, wherein the deposition precursors comprise a silicon-carbon-and-hydrogen-containing precursor and either or both ammonia ($NH_3$) and hydrazine ($N_2H_4$), and wherein a substrate is disposed within the processing region;
forming plasma effluents of the deposition precursors, wherein the plasma effluents are formed at a plasma power of less than or about 2,000 W; and
depositing a layer of silicon-and-nitrogen-containing material on the substrate.

2. The semiconductor processing method of claim 1, wherein the silicon-carbon-and-hydrogen-containing precursor comprises trimethylsilane, bis(trimethylsilyl) methane, or 1,1,3,3-tetramethyl-1,3-disilacyclobutane.

3. The semiconductor processing method of claim 1, wherein the silicon-carbon-and-hydrogen-containing precursor further comprises oxygen.

4. The semiconductor processing method of claim 3, wherein the silicon-carbon-and-hydrogen-containing precursor comprises dimethyldimethoxysilane, 1,1,3,3-tetramethyl-1,3-dimethoxydisiloxane, or methoxy (dimethyl) silylmethane.

5. The semiconductor processing method of claim 1, wherein the deposition precursors further comprise a carbon-containing precursor.

6. The semiconductor processing method of claim 5, wherein the carbon-containing precursor comprises ethylene ($C_2H_4$).

7. The semiconductor processing method of claim 5, further comprising:

increasing a flow rate of the silicon-carbon-and-hydrogen-containing precursor or a flow rate of the carbon-containing precursor;

reducing a flow rate of either or both $NH_3$ and $N_2H_4$; or both.

8. The semiconductor processing method of claim 1, wherein the layer of silicon-and-nitrogen-containing material is characterized by a thickness of greater than or about 750 Å.

9. The semiconductor processing method of claim 1, wherein a pressure in the semiconductor processing chamber is maintained at greater than or about 2 Torr.

10. The semiconductor processing method of claim 1, wherein the layer of material is characterized by a carbon concentration of greater than or about 10.0 at. %.

11. A semiconductor processing method comprising:

providing deposition precursors to a processing region of a semiconductor processing chamber, wherein the deposition precursors comprise a silicon-containing precursor, wherein a substrate is disposed within the processing region;

forming plasma effluents of the deposition precursors; and depositing a layer of silicon-containing material on the substrate, wherein a pressure in the semiconductor processing chamber is maintained at greater than or about 3 Torr, wherein the layer of silicon-containing material is characterized by a carbon concentration of greater than or about 12.0 at. %, and wherein a flow rate of the silicon-containing precursor is increased while depositing the layer of silicon-containing material.

12. The semiconductor processing method of claim 11, wherein the silicon-containing precursor comprises a silicon-carbon-and-hydrogen-containing precursor or a silicon-oxygen-carbon-and-hydrogen-containing precursor.

13. The semiconductor processing method of claim 11, wherein the deposition precursors further comprise a nitrogen-containing precursor.

14. The semiconductor processing method of claim 13, further comprising:

increasing a flow rate of the silicon-containing precursor while depositing the layer of silicon-containing material;

reducing a flow rate of the nitrogen-containing precursor while depositing the layer of silicon-containing material; or both.

15. The semiconductor processing method of claim 11, wherein the plasma effluents are formed at a plasma power of less than or about 1,500 W.

16. The semiconductor processing method of claim 11, wherein a temperature within the processing region is maintained at less than or about 500° C.

17. A semiconductor processing method comprising:

providing deposition precursors to a processing region of a semiconductor processing chamber, wherein the deposition precursors comprise a silicon-containing precursor, wherein a substrate is disposed within the processing region;

forming plasma effluents of the deposition precursors; and depositing a layer of silicon-containing material on the substrate, wherein the layer of silicon-containing material is characterized by a dielectric constant of less than or about 3.5, and wherein a flow rate of the silicon-containing precursor is increased while depositing the layer of silicon-containing material.

18. The semiconductor processing method of claim 17, further comprising:

exposing the layer of silicon-containing material to ultraviolet light to provide a cured layer of silicon-containing material.

19. The semiconductor processing method of claim 17, wherein the layer of silicon-containing material is characterized by a carbon concentration of greater than or about 15.0 at. %.

20. The semiconductor processing method of claim 17, further comprising:

exposing the as-deposited silicon-containing material to an ultraviolet (UV) treatment.

* * * * *